United States Patent [19]
Fulford, Jr.

[11] Patent Number: 5,789,300
[45] Date of Patent: Aug. 4, 1998

[54] METHOD OF MAKING IGFETS IN DENSELY AND SPARSELY POPULATED AREAS OF A SUBSTRATE

[75] Inventor: H. Jim Fulford, Jr., Austin, Tex.

[73] Assignee: Advanced Micro Devices, Inc., Sunnyvale, Calif.

[21] Appl. No.: 805,541

[22] Filed: Feb. 25, 1997

[51] Int. Cl.$^6$ .................................................. H01L 21/70
[52] U.S. Cl. ...................... 438/301; 438/587; 438/949; 430/313; 430/315
[58] Field of Search .......................... 438/301, 587, 438/949; 430/313, 315

[56] References Cited

U.S. PATENT DOCUMENTS

| | | | |
|---|---|---|---|
| 3,649,393 | 3/1972 | Hatzakis | 438/949 |
| 4,345,366 | 8/1982 | Brower | 29/571 |
| 4,847,213 | 7/1989 | Pfiester | 437/24 |
| 5,169,796 | 12/1992 | Murray et al. | 437/41 |
| 5,330,924 | 7/1994 | Huang et al. | 438/587 |
| 5,378,646 | 1/1995 | Huang et al. | 438/587 |
| 5,455,444 | 10/1995 | Hsue | 257/413 |
| 5,498,501 | 3/1996 | Shimoda et al. | 438/949 |
| 5,512,500 | 4/1996 | Oyamatsu | 438/949 |

FOREIGN PATENT DOCUMENTS

| | | | |
|---|---|---|---|
| 62-35667 | 2/1987 | Japan | H01L 27/08 |

OTHER PUBLICATIONS

U.S. Patent Application Serial No. 08/623,802, filed Mar. 29, 1996, entitled "Method of Processing a Semiconductor Wafer For Controlling Drive Current", by Fulford, Jr. et al.

*Primary Examiner*—John Niebling
*Assistant Examiner*—Richard A. Booth
*Attorney, Agent, or Firm*—Skjerven, Morrill, MacPherson, Franklin & Friel, LLP; David M. Sigmond

[57] ABSTRACT

A method of making IGFETs in densely and sparsely populated areas of a substrate is disclosed. The method includes providing a semiconductor substrate with first and second regions, forming a gate material over the first and second regions, forming a photoresist layer over the gate material, irradiating the photoresist layer with a first image pattern over the first region wherein the first image pattern has a first radiation energy per unit area of the photoresist layer, irradiating the photoresist layer with a second image pattern over the second region wherein the second image pattern has a second radiation energy per unit area of the photoresist layer, developing the photoresist layer to provide selected openings above the substrate, applying an etch using the photoresist layer as an etch mask such that the etch removes portions of the gate material over the first region with a first etch bias and removes portions of the gate material over the second region with a second etch bias to form a first gate over the first region and a second gate over the second region, wherein the first region is in an area of the substrate that is densely populated with gates, the second region is in an area of the substrate that is sparsely populated with gates, and a difference between the first and second radiation energies per unit area offsets a difference between the first and second etch biases, and forming sources and drains in the first and second regions. Preferably, the first and second image patterns are applied with different exposure times to provide different photoresist linewidths that offset the first and second etch biases for densely-packed and isolated polysilicon gates.

20 Claims, 3 Drawing Sheets

METHOD OF MAKING IGFETS IN DENSELY AND SPARSELY POPULATED AREAS OF A SUBSTRATE

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a -ate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

As IGFET dimensions are reduced and the supply voltage remains constant (e.g., 3 V), the maximum lateral electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate, and a heavy implant is self-aligned to the gate on which sidewall spacers have been formed. The spacers are typically oxides or nitrides. The purpose of the lighter first dose is to form a lightly doped region of the drain (or LDD) at the edge near the channel. The second heavier dose forms a heavily doped low resistivity region of the drain. The lightly doped and heavily doped regions are subsequently merged using a high-temperature anneal that drives-in and activates the implanted dopants. Since the heavily doped region is farther away from the channel than a conventional drain structure, the depth of the heavily doped region can be made somewhat greater without adversely affecting the device characteristics.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide the gate.

Photolithography is frequently used to create patterns that define where the polysilicon layer is etched. Typically, the wafer is cleaned and prebaked to drive off moisture and promote adhesion, an adhesion promoter is deposited on the wafer, a few milliliters of positive photoresist are deposited onto the spinning wafer to provide a uniform layer, the photoresist is soft baked to drive off excess solvents, the photoresist is irradiated with an image pattern that renders selected portions of the photoresist soluble, a developer removes the irradiated portions of the photoresist, an optional de-scum removes very small quantities of photoresist in unwanted areas, the photoresist is hard baked to remove residual solvents and improve adhesion and etch resistance, the etch is applied using the photoresist as an etch mask, and the photoresist is stripped. Therefore, the photoresist has the primary functions of replicating the image pattern and protecting the underlying polysilicon when etching occurs.

The process of etching the polysilicon layer typically involves a plasma etching procedure in which a plasma generates reactive gas species that chemically etch the material in direct proximity to the plasma. In general, the etch is highly anisotropic and forms the gate with vertical sidewalls since tapered sidewalls might affect the channel length. In addition, the etch is highly selective of polysilicon with respect to the underlying silicon dioxide. To meet these requirements, the etch typically utilizes etch gases containing both chlorine (such as $Cl_2$) and fluorine (such as $SF_6$).

In general, the etch is not capable of precisely transferring the pattern established by the photoresist into the underlying polysilicon layer. Etch bias and tolerance are two parameters used to indicate the degree to which the etch process deviates from the ideal. Etch bias is the difference in lateral dimension between the etched image and the photoresist pattern. That is, etch bias measures the amount by which the polysilicon is undercut beneath the photoresist. Tolerance is a measure of the statistical distribution of etch bias values that characterizes the uniformity of etching.

In many integrated circuits, individual devices in various areas are arranged in different configurations and densities. For example, some integrated circuits include devices having a wide range of functionality with the variability of functionality being reflected in a variability of layout configuration. One implication arising from the variability of configuration is that some areas of the integrated circuit are densely populated with devices and other areas include only relatively isolated devices.

Applicant has observed that the length (or critical dimension) of polysilicon gates is often narrower in densely populated areas of the substrate (with high density or densely-packed gates with narrow spacings therebetween) than in sparsely populated areas of the substrate (with low density or isolated gates with wide spacings therebetween). Applicant has also observed that the difference in gate lengths is accentuated as the dimensions are reduced. The difference in gate lengths may result from poorly-understood aspects of the chemistry of the plasma etching, such as acceleration in the rate of reactive ion etching in substrate areas having densely-packed gates and therefore less of the polysilicon layer exposed to the etch. Applicant believes the difference in gate lengths is due, at least in part, to a greater etch bias for the densely-packed gates than the isolated gates. Irrespective of the causes, since the gates provide implant masks for source/drain implants, the difference in gate lengths typically leads to different channel lengths.

The performance of an integrated circuit depends not only on the value of the channel lengths, but also upon the uniformity of the channel lengths. In an integrated circuit having some devices with relatively longer channel lengths and other devices with relatively shorter channel lengths, the devices with shorter channel lengths have a higher drain current than the devices with the longer channel lengths. The difference in drain currents can cause problems. For instance, devices with too large a drain current may have a high lateral electric field that causes significant hot carrier effects despite the presence of an LDD, whereas devices with too small a drain current may have unacceptably slow switching speeds. Therefore, the range of drain currents may adversely affect device performance, reliability, or both.

One solution to this problem, not found in the prior art, involves using a reticle that biases the image pattern in areas of the substrate with densely-packed polysilicon gates in comparison to areas of the substrate with isolated polysilicon gates, in order to offset differences in etch bias, as set forth in U.S. application Ser. No. 08/805,896 filed concurrently herewith, entitled "Method of Fabricating an Integrated Circuit Having Devices Arranged with Different Device Densities using a Bias Differential to Form Devices with a Uniform Size" by Fulford, Jr. et al. Advantageously, this solution can be implemented using a single reticle and a single exposure step for both densely-packed and isolated polysilicon gates.

The difference in length between feature sizes on a given reticle, however, is often limited to a given increment, which in turn limits the difference in length between feature sizes of the image pattern generated by projecting radiation through the reticle and a lens onto the photoresist layer. In some instances, the image pattern may be adjustable only in increments that exceed the etch bias. If, for instance, the difference in feature sizes of the image pattern is adjustable in increments of 500 angstroms, yet the difference in etch bias between densely-packed polysilicon gates and isolated polysilicon gates is on the order of 300 angstroms, then it may be desirable to utilize another technique that further improves the uniformity of the gate lengths.

Accordingly, a need exists for an improved method of making IGFETs that offsets different etch biases between densely-packed and isolated polysilicon gates.

SUMMARY OF THE INVENTION

An object of the present invention is to reduce the effects of unwanted etch bias during the fabrication of semiconductor devices.

In accordance with one aspect of the invention, a method of making IGFETs includes providing a semiconductor substrate with first and second regions, forming a gate material over the first and second regions, forming a photoresist layer over the gate material, irradiating the photoresist layer with a first image pattern over the first region wherein the first image pattern has a first radiation energy per unit area of the photoresist layer, irradiating the photoresist layer with a second image pattern over the second region wherein the second image pattern has a second radiation energy per unit area of the photoresist layer, developing the photoresist layer to provide selected openings above the substrate, applying an etch using the photoresist layer as an etch mask such that the etch removes portions of the gate material over the first region with a first etch bias and removes portions of the gate material over the second region with a second etch bias to form a first gate over the first region and a second gate over the second region, wherein the first region is in an area of the substrate that is densely populated with gates, the second region is in an area of the substrate that is sparsely populated with gates, and a difference between the first and second radiation energies per unit area offsets a difference between the first and second etch biases, and forming sources and drains in the first and second regions.

Preferably, the first image pattern is applied with a shorter exposure time then the second image pattern so that the photoresist layer has a larger linewidth over the first active area than over the second active area, the first etch bias is greater than the second etch bias, and the first and second gates are polysilicon gates with essentially identical lengths. In this manner, the difference in exposure times offsets the difference in etch biases. Moreover, the difference in length between the first and second gates is not limited by the patterning capability of a single image pattern.

Forming the sources and drains may include implanting lightly doped source/drain regions into the first region outside the first gate, implanting lightly doped source/drain regions into the second region outside the second gate, forming first and second spacers adjacent to the first and second gates, implanting heavily doped source/drain regions into the first region outside the first gate and first spacers, implanting heavily doped source/drain regions into the second region outside the second gate and second spacers, and applying a high-temperature anneal to drive-in and activate the implanted dopants.

Advantageously, the present invention provides for fabricating densely-packed and isolated gates in densely and sparsely populated areas of the substrate such that the gates have essentially identical lengths despite different etch biases in these areas. This, in turn, provides for better control over the drain currents.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
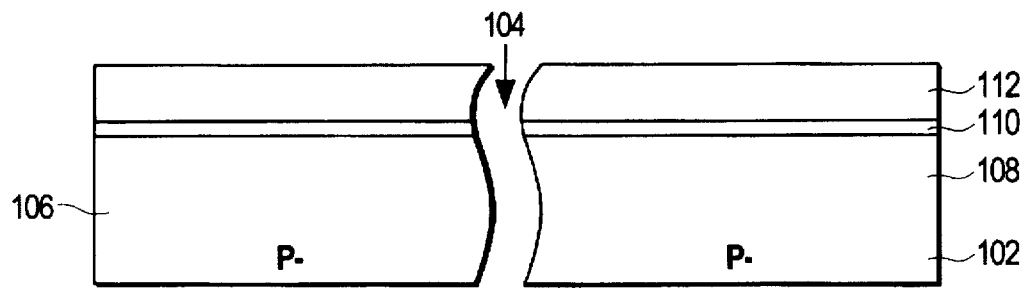
FIGS. 1A–1J show cross-sectional views of successive process steps for making IGFETs in densely and sparsely populated areas of a substrate in accordance with an embodiment of the invention.

In the drawings, depicted elements are not necessarily drawn to scale and like or similar elements may be designated by the same reference numeral throughout the several views.

FIGS. 1A–1J show cross-sectional views of successive process steps for making IGFETs in densely and sparsely populated areas of a substrate in accordance with an embodiment of the invention.

In FIG. 1A, silicon substrate 102 suitable for integrated circuit manufacture is provided. Substrate 102 includes a P-type epitaxial surface layer disposed on a P+base layer (not shown). The epitaxial surface layer has a boron background concentration on the order of $1 \times 10^{15}$ atoms/cm$^3$, a <100> orientation and a resistivity of 12 ohm-cm. For convenience of explanation, region 104 of substrate 102 is not shown. Substrate 102 includes region 106 and region 108 adjacent to region 104. Region 106 is in an area of substrate 102 that shall be densely populated with gates, and the densely-packed gates to be formed in this area will be spaced from the closest adjacent gate by the minimum resolution of a photolithographic system, which is less than one micron. On the other hand, region 108 is in an area of substrate 102 that shall be sparsely populated with gates, and the isolated gates to be formed in this area will be spaced from the closest adjacent gate by more than one micron. Of course, these dimensions are exemplary.

A blanket layer of gate oxide 110, composed of silicon dioxide ($SiO_2$), is formed on the top surface of substrate 102 using tube growth at a temperature of 700° to 1000° C. in an $O_2$ containing ambient. Gate oxide 110 has a thickness in the range of 30 to 100 angstroms. Thereafter, a blanket layer of undoped polysilicon 112 is deposited by low pressure chemical vapor deposition (LPCVD) on the top surface of gate oxide 110. Polysilicon 112 has a thickness of 2000 angstroms. If desired, polysilicon 112 can be doped in situ as deposition occurs, or doped before a subsequent etch step by implanting arsenic with a dosage in the range of $1 \times 10^{15}$ to $5 \times 10^{15}$ atoms/$cm^2$ and an energy in the range of 2 to 80 kiloelectron-volts. However, it is generally preferred that polysilicon 112 be doped during later processing steps.

Figure 1B:
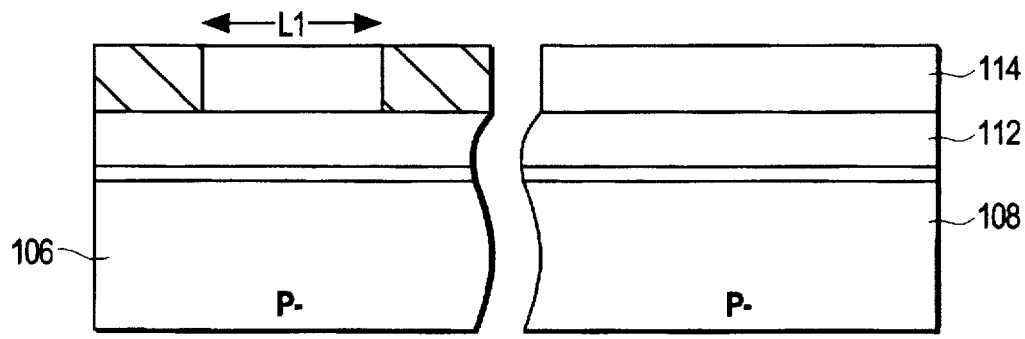

In FIG. 1B, photoresist 114 is deposited on polysilicon 112. The photolithographic system, such as a step and repeat optical projection system which generates deep ultraviolet light from a mercury-vapor lamp, uses a first reticle to irradiate photoresist 114 with a first image pattern above portions of region 106 and outside region 108. The first image pattern is applied for a first exposure time, and defines a first unirradiated gap (where the light is blocked) over region 106. The regions of photoresist 114 that the first image pattern renders soluble to a subsequent developer are shown by the cross-hatched diagonal lines extending from the upper left to the lower right. Photoresist 114 above region 106 has a predetermined linewidth or length L1 of 3700 angstroms that remains insoluble to the developer.

Figure 1C:
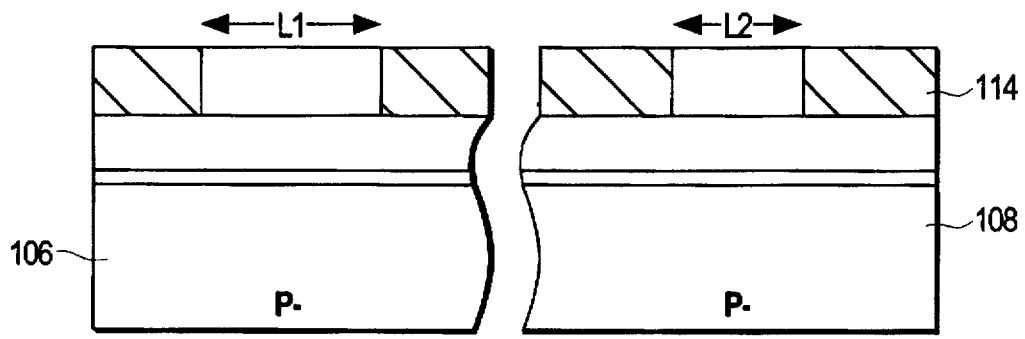

In FIG. 1C, the photolithographic system uses a second reticle to irradiate photoresist 114 with a second image pattern above portions of region 108 and outside region 106 after the first image pattern is discontinued. The second image pattern, which has a different configuration than the first image pattern, is applied for a second exposure time that is longer than the first exposure time, and defines a second unirradiated gap (where the light is blocked) over region 108. The regions of photoresist 114 that the second image pattern renders soluble to the developer are shown by the cross-hatched diagonal lines extending from the upper right to the lower left. Photoresist 114 above region 108 has a predetermined linewidth or length L2 of 3500 angstroms that remains insoluble to the developer.

Of importance, the first and second unirradiated gaps have essentially identical lengths in the direction of lengths L1 and L2. However, length L1 is 200 angstroms longer than length L2. This is achieved by providing the second image pattern with a longer exposure time than the first image pattern since, under appropriate conditions, a linear relationship exists between exposure time and photoresist linewidth change. See, for instance, SILICON PROCESSING FOR THE VLSI ERA, Volume 1: Process Technology, by S. Wolf and R. N. Tauber, published by Lattice Press, Sunset Beach, Calif., p. 437 (1986). During irradiation, the linewidths of photoresist 114 corresponding to lengths L1 and L2 decrease at about 10 angstroms per millijoule/$cm^2$. Therefore, providing the second image pattern with a longer exposure time than the first image pattern causes length L2 to be smaller than length L1. Moreover, the exposure times for the first and second image patterns can be adjusted to compensate for other factors, such as changes in intensity of the mercury-vapor lamp due to humidity, pressure or aging, that might otherwise affect lengths L1 and L2.

Figure 1D:
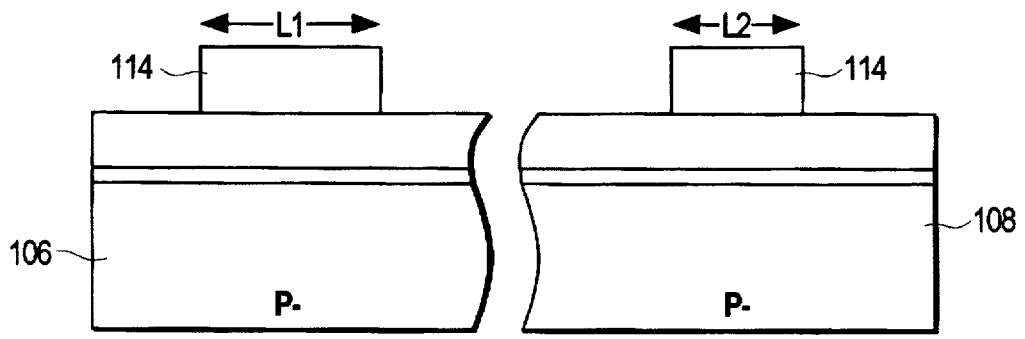

In FIG. 1D, the developer is applied to remove the regions of photoresist 114 rendered soluble by the first or second image patterns. The developer concentration, developer temperature and developer agitation method should be optimized so that the developer causes minimal pattern disruption, and the remaining photoresist 114 above regions 106 and 108 correspond to lengths L1 and L2, respectively.

Figure 1E:
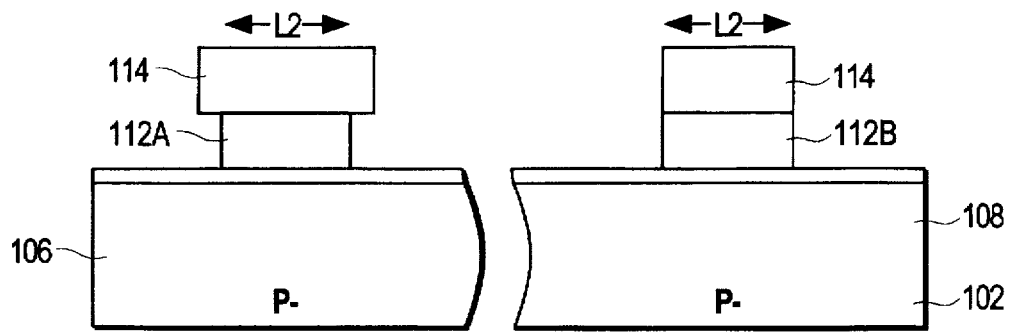

In FIG. 1E, a highly anisotropic dry etch is applied using a plasma etching procedure in which a plasma generates reactive gas species that chemically etch the material in direct proximity to the plasma. The dry etch removes regions of polysilicon 112 exposed by the openings in photoresist 114. The dry etch is highly selective of polysilicon 112 and non-selective of gate oxide 110 so that only a negligible amount of gate oxide 110 is removed and substrate 102 is unaffected. Since region 106 is in an area of substrate 102 that is densely populated with gates, and region 108 is in an area of substrate 102 that is sparsely populated with gates, photoresist 114 is patterned to expose a far greater amount of polysilicon 112 in the sparsely populated area than in the densely populated area. Moreover, the etch bias in a particular area increases as the amount of exposed polysilicon in that area decreases. As a result, the dry etch removes polysilicon 112 in the densely populated area with a first etch bias, the dry etch removes polysilicon 112 in the sparsely populated area with a second etch bias, and the first etch bias exceeds the second etch bias. The dry etch significantly overetches and undercuts polysilicon 112 in the densely populated area, but provides essentially no overetching or undercut of polysilicon 112 in the sparsely populated area. After etching occurs, first gate 112A of the remaining polysilicon 112 over region 106 has a length of 3500 angstroms, corresponding to length L2, and second gate 112B of the remaining polysilicon 112 over region 108 also has a length of 3500 angstroms, corresponding to length L2. In effect, the different exposure times of the first and second image patterns offset the different etch biases in the densely and sparsely populated areas so that gates 112A and 112B have essentially identical lengths. It should be noted that first gate 112A is among other densely-packed gates (not shown) spaced from the closest adjacent gate by less than one micron, and second gate 112B is among other isolated gates (not shown) spaced from the closest adjacent gate by more than one micron.

Figure 1F:
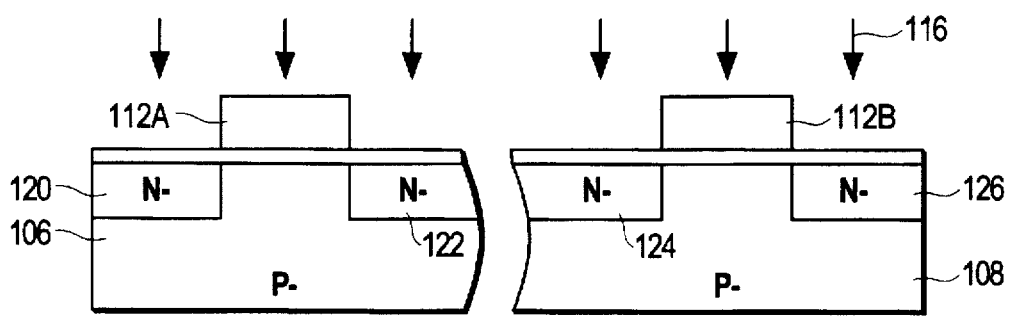

In FIG. 1F, photoresist 114 is stripped, and lightly doped source and drain regions are implanted into regions 106 and 108 by subjecting the structure to ion implantation of arsenic, indicated by arrows 116, at a dose in the range of $1 \times 10^{13}$ to $5 \times 10^{14}$ atoms/$cm^2$ and an energy in the range of 2 to 80 kiloelectron-volts, using first gate 112A as an implant mask for region 106 and second gate 112B as an implant mask for region 108. As a result, lightly doped source/drain regions 120 and 122 are implanted in region 106 and are self-aligned to the edges of first gate 112A, and lightly doped source/drain regions 124 and 126 are implanted into region 108 and are self-aligned to the edges of second gate 112B. Lightly doped source/drain regions 120, 122, 124 and 126 are doped N− with an arsenic concentration in the range of about $1 \times 10^{17}$ to $1 \times 10^{18}$ atoms/$cm^3$ and a depth in the range of 100 to 1500 angstroms.

Figure 1G:
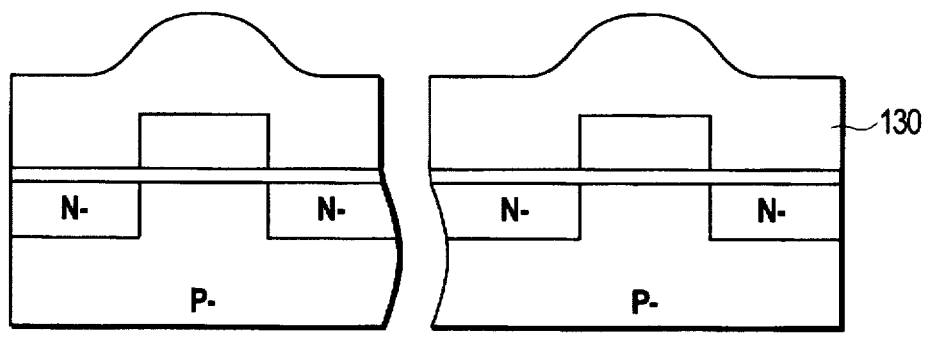

In FIG. 1G, oxide layer 130 with a thickness of 2500 angstroms is conformally deposited over the exposed surfaces by plasma enhanced chemical vapor deposition at a temperature in the range of 300° to 450° C.

Figure 1H:
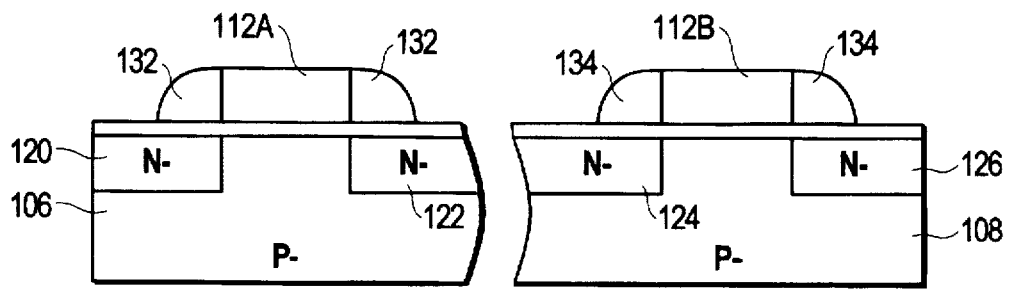

In FIG. 1H, oxide layer 130 is subjected to an anisotropic reactive ion etch (RIE) that forms sidewall spacers 132 over region 106 and adjacent to the opposing edges of first gate 112A, and sidewall spacers 134 over region 108 and adjacent to the opposing edges of second gate 112B. Spacers 132 cover portions of lightly doped source/drain regions 120 and 122 adjacent to first gate 112A, and spacers 134 cover portions of lightly doped source/drain regions 124 and 126 adjacent to second gate 112B.

Figure 1I:
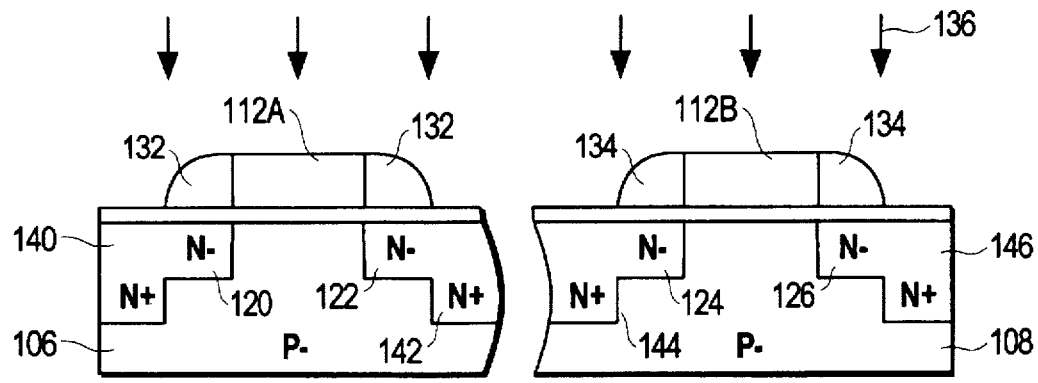

In FIG. 1I, heavily doped source and drain regions are implanted into regions 106 and 108 by subjecting the structure to ion implantation of arsenic, indicated by arrows 136, at a dose in the range of $1\times10^{15}$ to $5\times10^{15}$ atoms/cm$^2$ and an energy in the range of 2 to 80 kiloelectron-volts, using first gate 112A and spacers 132 as an implant mask for region 106 and second gate 112B and spacers 134 as an implant mask for region 108. As a result, heavily doped source/drain regions 140 and 142 are implanted in region 106 and are self-aligned to the outside edges of spacers 132, and heavily doped source/drain regions 144 and 146 are implanted in region 108 and are self-aligned to the outside edges of spacers 134. Heavily doped source/drain regions 140, 142, 144 and 146 are doped N+ with an arsenic concentration in the range of about $1\times10^{18}$ to $1\times10^{20}$ atoms/cm$^3$ and a depth in the range of 200 to 3000 angstroms. Preferably, the depth of heavily doped source/drain regions 140, 142, 144 and 146 exceeds that of lightly doped source/drain regions 120, 122, 124 and 126.

Figure 1J:
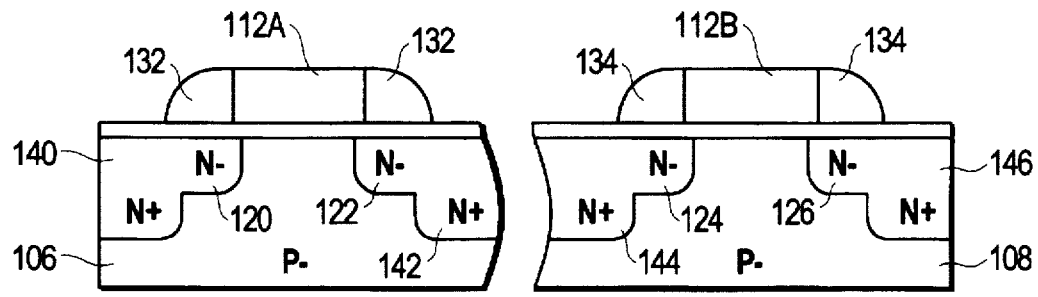

In FIG. 1J, the device is annealed to remove crystalline damage and to drive-in and activate the implanted dopants by applying a rapid thermal anneal on the order of 950° to 1050° C. for 10 to 30 seconds. Source regions 120 and 140 form a source and drain regions 122 and 142 form a drain for an NMOS device in region 106 controlled by first gate 112A. Likewise, source regions 124 and 144 form a source and drain regions 126 and 146 form a drain for an NMOS device in region 108 controlled by second gate 112B. Since the dopants diffuse both vertically and laterally, heavily doped regions 140 and 142 extend partially beneath spacers 132, and heavily doped regions 144 and 146 extend partially beneath spacers 134. Similarly, lightly doped regions 120 and 122 extend slightly beneath first gate 112A, and lightly doped regions 124 and 126 extend slightly beneath second gate 1 12B. Of importance, the channel lengths in regions 106 and 108 are essentially identical, despite the different etch biases used to pattern gates 112A and 112B.

For illustration purposes, gates 112A and 112B are intended to be electrically coupled by a continuous interconnect line patterned from polysilicon 112. Since, however, the first and second image patterns are applied in sequence using two separate masks, the potential exists for misalignment or displacement between the regions of the interconnect line intended to contact one another. A sufficient misalignment or displacement may prevent the gates from electrically coupling to one another, thereby causing the circuit to become defective. Various stitching techniques for coupling elements patterned by separate masks can be used.

Figure 2:
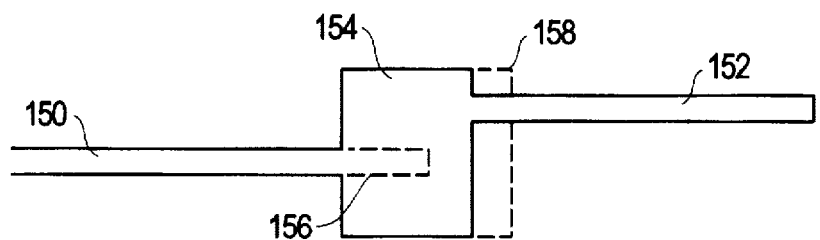
FIG. 2 shows a top plan view of a stitching technique for coupling the gates of the IGFETs.

FIG. 2 shows a top plan view of a stitching technique for coupling interconnect lines coupled to gates 112A and 112B. Interconnect line 150 is coupled to first gate 112A, and interconnect line 152 is coupled to second gate 112B. First gate 112A, interconnect line 150 and contact region 154 are defined by the first image pattern, and second gate 112B and interconnect line 152 are defined by the second image pattern. Broken lines 156 depict a distal end of interconnect line 150 that would be formed in the absence of contact region 154. As is seen, interconnect line 152 is misaligned both vertically and laterally with respect to interconnect line 150 in the absence of contact region 154. However, contact region 154 compensates for this misalignment. Broken lines 158 depict a portion of contact region 154 defined by the first image pattern before the second image pattern is applied. When the second image pattern is applied, the portion of contact region 154 depicted by broken lines 158 is irradiated and therefore removed. Nonetheless, interconnect line 152 is coupled by the remaining portion of contact region 154 to interconnect line 150 despite the misalignment, thereby coupling gates 1 12A and 1 12B. Further details regarding this stitching technique are disclosed in U.S. application Ser. No. 08/805,534 filed concurrently herewith, entitled "Method of Stitching Segments Defined by Adjacent Image Patterns During the Manufacture of a Semiconductor Device" by Fulford, Jr. et al., which is incorporated herein by reference.

Further processing steps in the fabrication of IGFETs typically include forming salicide contacts on the gates, sources and drains, forming a thick oxide layer over the regions, forming contact windows in the oxide layer to expose the salicide contacts, forming interconnect metallization in the contact windows, and forming a passivation layer over the metallization. In addition, earlier or subsequent high-temperature process steps can be used to supplement or replace the anneal step to provide the desired anneal, activation, and drive-in functions. These further processing steps are conventional and need not be repeated herein. Likewise the principal processing steps disclosed herein may be combined with other steps apparent to those skilled in the art.

The present invention includes numerous variations to the embodiment described above. For instance, the gate can be various conductors, and the gate insulator and spacers can be various dielectrics. The LDDs are not essential. Suitable N-type dopants include arsenic and phosphorus; suitable P-type dopants include boron $B_{10}$, boron $B_{11}$, and $BF_X$ species such as $BF_2$.

Preferably, the difference in linewidths of the photoresist layer over the regions with densely-packed and isolated gates is in the range of 20 to 500 angstroms. Furthermore, several approaches can be used to provide the photoresist layer with different linewidths. For instance, the linewidth variations can be due primarily to variations in radiation intensity, radiation exposure time, or both, as long as the first and second image patterns exhibit different radiation energies per unit area of photoresist. Moreover, the first and second image patterns offset the difference between the first and second etch biases in whole or in part, thereby reducing or eliminating the difference.

The invention is particularly well-suited for fabricating N-channel MOSFETs, P-channel MOSFETs and other types of IGFETs, particularly for high-performance microprocessors where high circuit density is essential. Although a single pair of N-channel devices has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making IGFETs in densely and sparsely populated areas of a substrate, comprising the steps of:

providing a semiconductor substrate with first and second regions;

forming a gate material over the first and second regions;

forming a photoresist layer over the gate material;

irradiating the photoresist layer with a first image pattern over the first region, wherein the first image pattern has a first radiation energy per unit area of the photoresist layer;

irradiating the photoresist layer with a second image pattern over the second region, wherein the second image pattern has a second radiation energy per unit area of the photoresist layer;

developing the photoresist layer to provide selected openings above the substrate;

applying an etch using the photoresist layer as an etch mask such that the etch removes portions of the gate material over the first region with a first etch bias and removes portions of the gate material over the second region with a second etch bias to form a first gate over the first region and a second gate over the second region, wherein the first region is in an area of the substrate that is densely populated with gates, the second region is in an area of the substrate that is sparsely populated with gates, and a difference between the first and second radiation energies per unit area offsets a difference between the first and second etch biases;

forming a source and drain in the first region; and forming a source and drain in the second region.

2. The method of claim 1, wherein:

the first radiation energy per unit area has a first exposure time;

the second radiation energy per unit area has a second exposure time; and the difference between the first and second radiation energies per unit area is due to a difference between the first and second exposure times.

3. The method of claim 1, wherein:

the first radiation energy per unit area has a first radiation intensity;

the second radiation energy per unit area has a second radiation intensity; and the difference between the first and second radiation energies per unit area is due to a difference between the first and second radiation intensities.

4. The method of claim 1, wherein the first and second image patterns provide first and second unirradiated gaps with essentially identical lengths over the first and second regions.

5. The method of claim 1, wherein applying the etch includes using the photoresist layer as an etch mask with a first linewidth over the first region and a second linewidth over the second region.

6. The method of claim 5, wherein the first radiation energy per unit area is less than the second radiation energy per unit area, the first linewidth is greater than the second linewidth, and the first etch bias is greater than the second etch bias.

7. The method of claim 1, wherein the first and second gates have essentially identical lengths.

8. The method of claim 1, wherein the first gate is spaced from a closest adjacent gate by less than 1 micron, and the second gate is spaced from a closest adjacent gate by greater than one micron.

9. A method of making IGFETs in densely and sparsely populated areas of a substrate, comprising the steps of:

providing a semiconductor substrate with first and second regions;

forming a gate insulator on the first and second regions;

forming a gate material on the gate insulator;

forming a photoresist layer over the gate material;

irradiating the photoresist layer with a first image pattern over the first region for a first exposure time;

irradiating the photoresist layer with a second image pattern over the second region for a second exposure time, wherein the first and second image patterns are applied in sequence and have different configurations, and the first exposure time is less than the second exposure time;

developing the photoresist layer to form a first pattern with a first linewidth and first openings over the first region and form a second pattern with a second linewidth and second openings over the second region, wherein the first openings are associated with the first image pattern, the second openings are associated with the second image pattern, and the first linewidth is greater than the second linewidth primarily due to the first exposure time being less than the second exposure time;

applying an etch through the first and second openings using the photoresist layer as an etch mask such that the etch removes portions of the gate material over the first region with a first etch bias and removes portions of the gate material over the second region with a second etch bias to form a first gate over the first region and a second gate over the second region, wherein the first region is in an area of the substrate that is densely populated with gates, the second region is in an area of the substrate that is sparsely populated with gates, and the first etch bias is greater than the second etch bias primarily due to a greater amount of the gate material being exposed over the second area than over the first area;

forming a source and drain in the first region; and forming a source and drain in the second region.

10. The method of claim 9, wherein:

the first linewidth is greater than the second linewidth due to the first exposure time being less than the second exposure time; and the first etch bias is greater than the second etch bias due to a greater amount of the gate material being exposed over the second area than over the first area.

11. The method of claim 9, wherein the first and second gates have essentially identical lengths.

12. The method of claim 9, wherein the first gate is spaced from a closest adjacent gate by less than 1 micron, and the second gate is spaced from a closest adjacent gate by greater than one micron.

13. The method of claim 9, wherein the first linewidth is in the range of 20 to 500 angstroms greater than the second linewidth.

14. The method of claim 9, wherein:
irradiating the photoresist layer with the first image pattern decreases the first linewidth at a rate of about 10 angstroms per millijoule/cm$^2$; and
irradiating the photoresist layer with the second image pattern decreases the second linewidth at a rate of about 10 angstroms per millijoule/cm$^2$.

15. The method of claim 9, wherein forming the sources and drains includes:
implanting a dopant into the first region after forming the first gate; and
implanting a dopant into the second region after forming the second gate.

16. The method of claim 9, wherein forming the sources and drains includes:
implanting a light dose of a dopant into the first region outside the first gate;
implanting a light dose of a dopant into the second region outside the second gate;
forming first spacers adjacent to the first gate and second spacers adjacent to the second gate;
implanting a heavy dose of a dopant into the first region outside the first gate and the first spacers; and
implanting a heavy dose of a dopant into the second region outside the second gate and the second spacers.

17. The method of claim 9, wherein the gate material is polysilicon.

18. A method of making IGFETs in densely and sparsely populated areas of a substrate, comprising the steps of:
providing a semiconductor substrate with first and second regions;
forming a gate insulator on the first and second regions;
forming a polysilicon layer on the gate insulator;
forming a photoresist layer over the polysilicon layer;
irradiating the photoresist layer with a first image pattern over the first region for a first exposure time;
irradiating the photoresist layer with a second image pattern over the second region for a second exposure time, wherein the first and second image patterns are applied in sequence and have different configurations, and the first exposure time is less than the second exposure time;
developing the photoresist layer to form a first pattern with a first linewidth and first openings over the first region and form a second pattern with a second linewidth and second openings over the second region, wherein the first openings are associated with the first image pattern, the second openings are associated with the second image pattern, and the first linewidth is greater than the second linewidth due to the first exposure time being less than the second exposure time;
applying an etch through the first and second openings using the photoresist layer as an etch mask such that the etch removes portions of the polysilicon layer over the first region with a first etch bias and removes portions of the polysilicon layer over the second region with a second etch bias to form a first polysilicon gate over the first region and a second polysilicon gate over the second region, wherein the first etch bias is greater than the second etch bias due to a greater amount of the polysilicon layer being exposed over the second area than over the first area, and a difference between the first and second exposure times offsets a difference between the first and second etch biases so that the first and second polysilicon gates have essentially identical lengths;
forming a source and drain in the first region; and
forming a source and drain in the second region.

19. The method of claim 1, including making an integrated circuit chip that includes the IGFETs.

20. The method of claim 1, including making an electronic system that includes a microprocessor, a memory and a system bus, and further includes the IGFETs.

* * * * *